United States Patent [19]
Illingworth

[11] Patent Number: 6,144,193
[45] Date of Patent: *Nov. 7, 2000

[54] ISOLATED TRANSFORMER COUPLED GATE DRIVE FOR SIGNALS HAVING VARIABLE DUTY CYCLE

[75] Inventor: Lewis Illingworth, Kensington, N.H.

[73] Assignee: Avionic Instruments, Inc., Avenel, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/758,643

[22] Filed: Nov. 27, 1996

Related U.S. Application Data

[63] Continuation of application No. 08/340,218, Nov. 16, 1994, abandoned.

[51] Int. Cl.[7] .................................................. G05F 1/40
[52] U.S. Cl. .......................... 323/284; 323/288; 327/307; 327/311
[58] Field of Search ............................. 323/304; 363/15, 363/16, 20, 21, 26, 131, 133, 134; 327/306, 307, 309, 310, 311, 165, 168

[56] References Cited

U.S. PATENT DOCUMENTS

| | | | |
|---|---|---|---|
| 4,462,069 | 7/1984 | Becky | 363/23 |
| 5,410,467 | 4/1995 | Smith et al. | 363/131 |
| 5,438,294 | 8/1995 | Smith | 327/384 |

*Primary Examiner*—Shawn Riley
*Attorney, Agent, or Firm*—Ward & Olivo

[57] ABSTRACT

An improved coupling circuit for use in switched power supplies and other applications utilizes a DC restoration circuit following the secondary stage of a coupling transformer to maintain a relatively constant DC component in the coupled waveform, regardless of its duty cycle. Advantages of the invention include better frequency response, lower noise, and better linearity.

14 Claims, 4 Drawing Sheets

VOLTAGE A-B

VOLTAGE C-D AND E-F

VOLTAGE A-B

VOLTAGE C-D AND E-F

FIG. 4
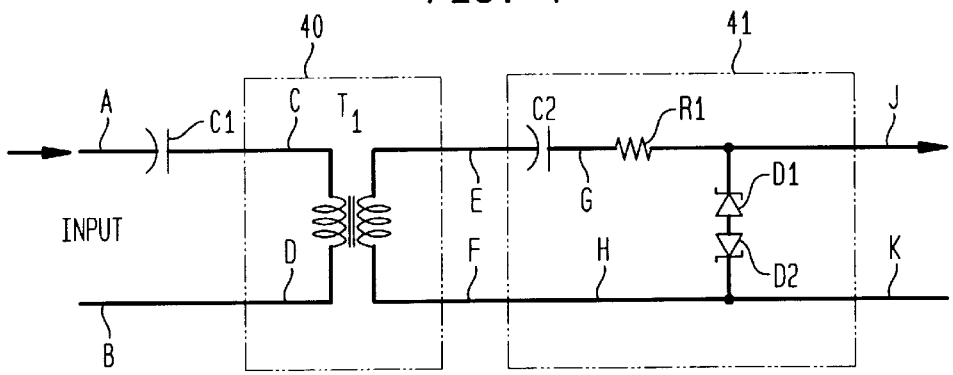
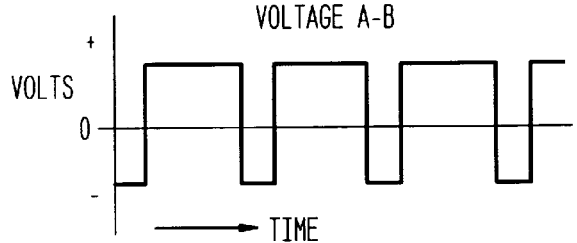
FIG. 4A
VOLTAGE A-B
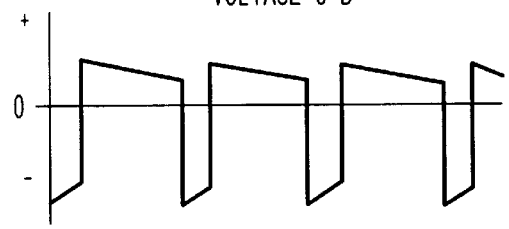
FIG. 4B
VOLTAGE C-D
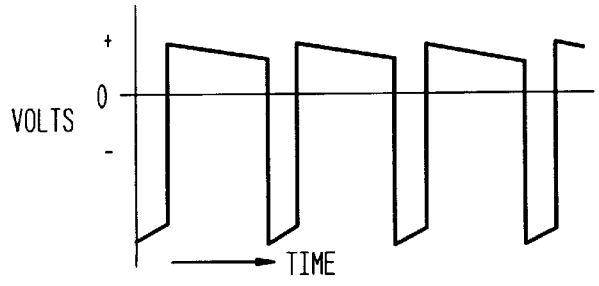
FIG. 4C
VOLTAGE E-F
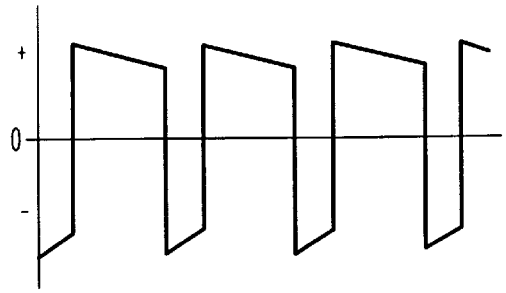
FIG. 4D
VOLTAGE G-H

VOLTAGE J-K

ISOLATED TRANSFORMER COUPLED GATE DRIVE FOR SIGNALS HAVING VARIABLE DUTY CYCLE

RELATEDNESS TO OTHER APPLICATIONS

This application is a continuation of application Ser. No. 08/340,218, filed Nov. 16, 1994, now abandoned.

FIELD OF THE INVENTION

The present invention relates generally to the application of voltages to the inputs of power semiconductors in the electronic circuitry of switching power supplies, inverters, frequency converters, switching amplifiers, motor control circuits and the like. In particular, the invention relates to the coupling of electronic pulses between two isolated circuits in such applications.

BACKGROUND OF THE INVENTION

A conventional DC-to-DC converter, as shown in FIG. 1, has a switching transistor Q connected through the primary winding of a transformer T between the positive and negative inputs. The switching transistor Q is enabled by a gate or base drive circuit 10, which in turn is enabled by a power supply control circuit 11. DC output voltage is referenced from an output control circuit 12. An isolated coupling 13 isolates the primary and secondary sides of the circuit and carries a control signal 14a–b—which is typically an analog voltage—between output control circuit 12 and power supply control circuit 11.

Unfortunately, such isolated couplings have many drawbacks. Opto-couplers, which are frequently used, suffer from variations in the coefficient of coupling between individual units, non-linearity, poor frequency response and a susceptibility to false signals due to high frequency voltage transients between primary and secondary circuits. A variety of alternative transformer couplings typically suffer from poor frequency response, beating effects with the main switching frequency, and sometimes produce a high frequency ripple which introduces noise in the output voltage.

Therefore, it would be highly desirable to provide an improved method and apparatus for coupling the primary and secondary stages of a switching power supply.

SUMMARY OF THE INVENTION

In view of the above, the object of the invention is a method for coupling primary and secondary stages of a switching power supply which mitigates one or more of the disadvantages associated with prior art approaches. Another object of the invention is an asymmetrical transformer coupling circuit adapted to perform such method.

In accordance with the invention, an asymmetrical transformer coupling is connected between the power supply control and switching transistor drive circuits. This coupling—which passes pulses having a wide range of duty cycles and maintains a substantially constant DC level— allows the power supply control circuit to be disposed among the secondary circuits. This, in turn, entirely eliminates the requirement for an isolated coupling of an analog voltage between primary and secondary circuits.

Elimination of the traditional isolated coupling is particularly useful in power systems that have high switching frequencies, in which fast control-loop response times are limited by conventional isolated couplings.

BRIEF DESCRIPTION OF THE FIGURES

The invention is best understood with reference to the detailed description below, which is intended to be read in conjunction with the set of drawings, in which:

FIG. 4 shows a transformer coupling having a DC restoring circuit in accordance with the invention;

FIGS. 4A–E show the response of the FIG. 4 circuit to 50% duty cycle and non-50% duty cycle input waveforms.

DETAILED DESCRIPTION OF THE INVENTION

Figure 3:
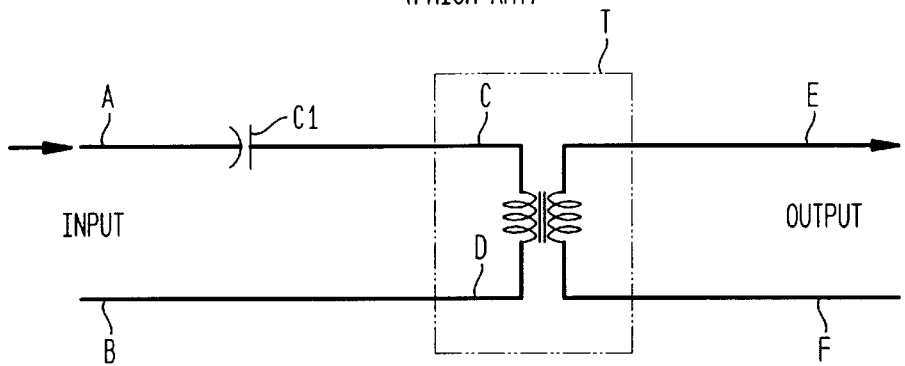
FIG. 3 shows a traditional transformer coupling circuit.

The invention is best understood by comparison to a conventional transformer coupling. Referring now to FIG. 3, which shows such a conventional transformer coupling, transformer T will couple any ac signal from its primary side (i.e., nodes C and D) to its secondary side (i.e., nodes E and F), providing that the integral of positive voltages with respect to time plus the integral of negative voltages is zero. That is to say: the DC component, or time-averaged value, of the signal across nodes E-F must be zero. If the input signal across nodes C-D does not maintain a zero DC component, flux in transformer T will steadily increase until its core saturates. When it is necessary to couple an "asymmetrical" signal (i.e., a signal with a non-zero DC component, such as a pulse train with a duty cycle other than 50-50), the input signal across nodes A-B must be coupled to transformer T through a blocking capacitor C1 in order to block the non-zero DC component of the input signal.

Figure 3A:
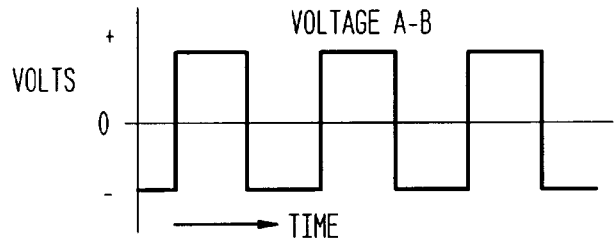
FIGS. 3A–D show the response of the FIG. 3 circuit to 50% duty cycle and non-50% duty cycle input waveforms.
Figure 3B:
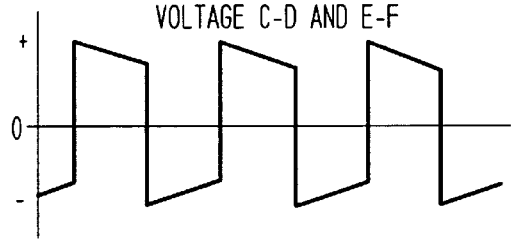

Reference is now made to FIGS. 3A–D, which depict the operation of the conventional FIG. 3 transformer coupling. FIG. 3A shows a symmetrical (i.e., 50-50 duty cycle, zero DC component) square wave applied to the input across nodes A-B. The voltage across transformer T's primary, nodes C-D, will, in fact, appear somewhat modified due to the finite impedance of the series capacitor and the shunt impedance due to the inductance of T's primary. Such an exemplary output waveform (across nodes E-F) is shown in FIG. 3B. Available transformers typically exhibit other non-ideal characteristics—such as winding capacitance, leakage inductance, resistive and eddy current losses, and core losses—that affect rise time, overshoot and ringing, and voltage drop. These effects, however, are ignored herein, since they do not affect the operation of the invention, which is best explained assuming "ideal" conditions.

Figure 3C:
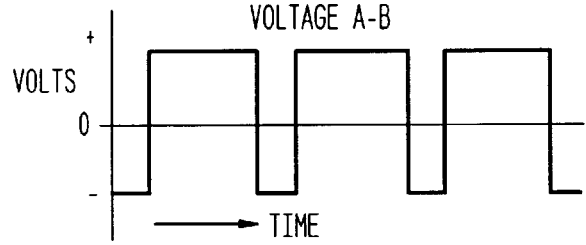
Figure 3D:
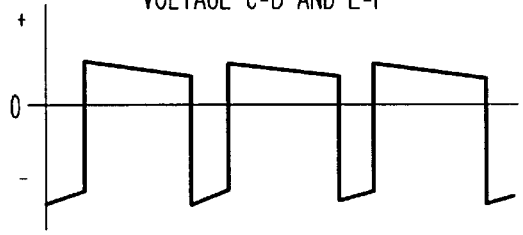

In FIG. 3C, an asymmetrical signal is applied to the input nodes A-B. As this signal passes through capacitor C1, its DC component is lost, and the signals across nodes C-D and E-F both take the shape shown in FIG. 3D. Since the positive pulses have a longer duration than the negative pulses, their amplitude is correspondingly smaller—so as to make the signal value, when integrated over a period of time, equal to zero.

Figure 1:
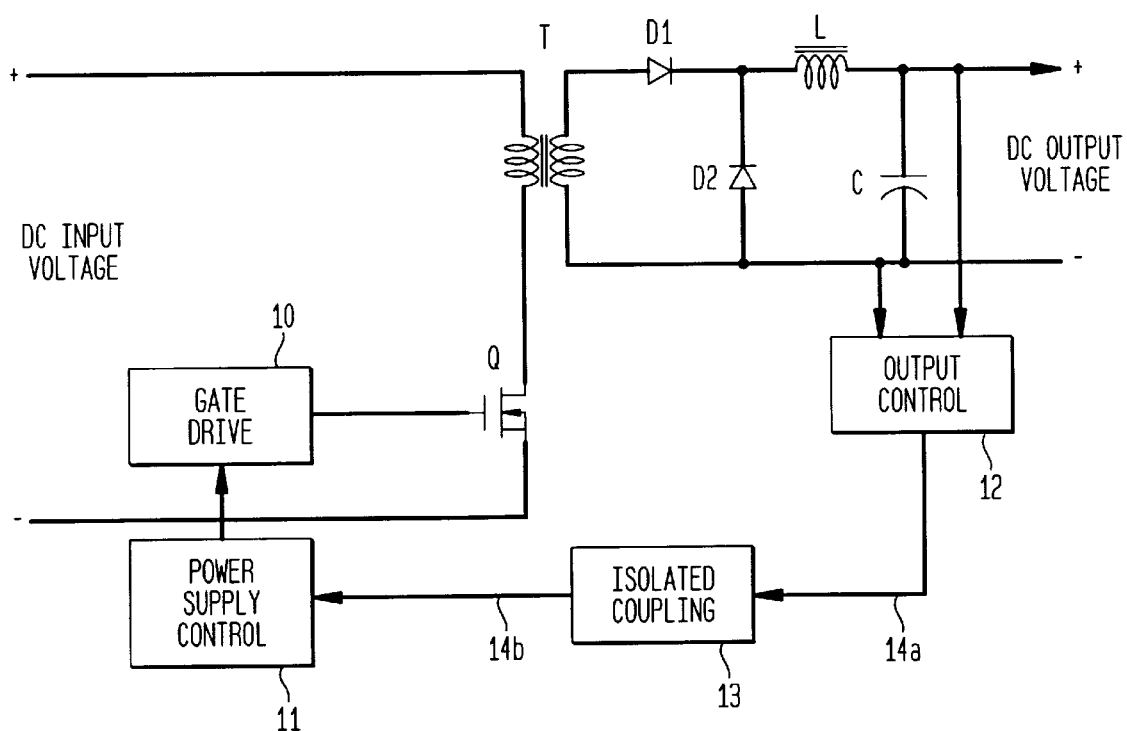
FIG. 1 shows a prior art switching power supply employing an isolated coupling between output control and power supply control circuits.
Figure 2:
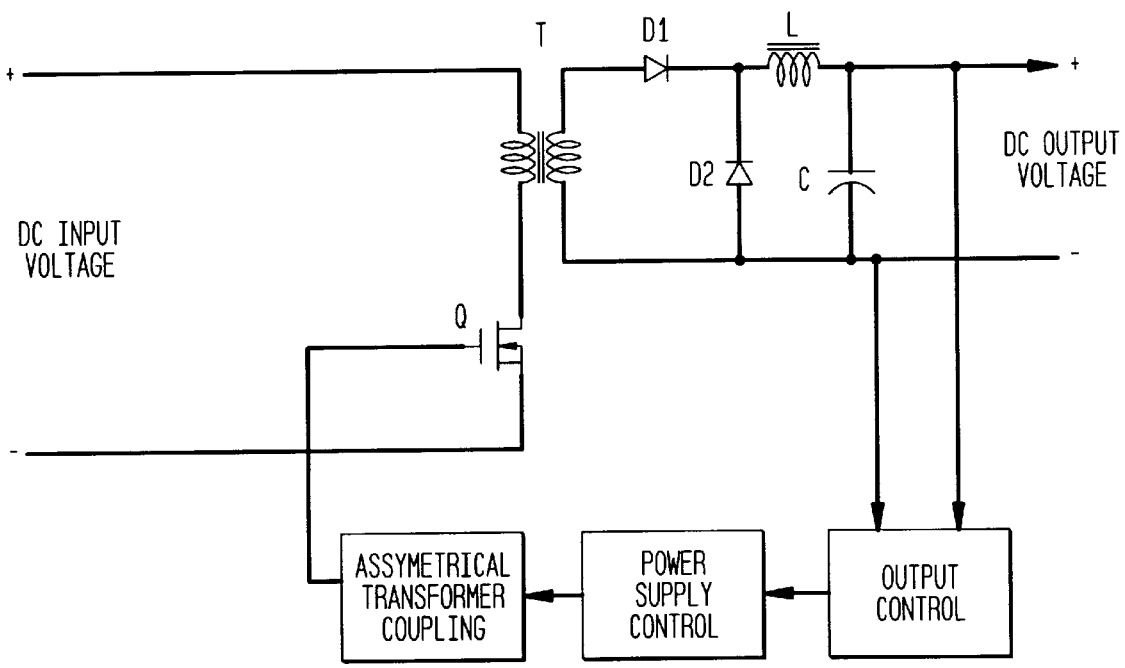
FIG. 2 shows a switching power supply employing an asymmetrical transformer coupling in accordance with the invention.

The conventional FIG. 3 circuit is frequently used to drive the gate of the switching transistor (transistor Q in FIGS. 1–2) when the input waveform has a 50-50 duty cycle, as in FIG. 3A. When the pulse is asymmetrical, as in FIG. 3C, however, the output voltage is unsuitable for a gate drive function because the positive output voltage is insufficiently high whereas the negative output is too low. The invention, as described below, overcomes this drawback by restoring the DC content to the output waveform.

Reference is now made to FIG. 4, which depicts a coupling circuit according to the invention comprising a conventional transformer coupling 40 followed by a DC restoration circuit 41. In view of the above, a method of coupling the primary and secondary stages of a switching power supply that mitigates one or more of the disadvantages of the above, as disclosed in prior art, is a transformer coupling to the switching transistor gate as shown in FIG. 2A (Prior Art). This transformer coupling has to handle asymmetrical drive signals, i.e. those having duty cycles other than 50-50.

One method of doing this is shown in FIG. 2A, with pertinent waveforms shown in FIG. 2B. The power supply control develops a pulse width modulated signal as shown for the voltage at node A. This signal, when coupled through capacitor C1 to transformer T1 primary, has a voltage waveform that, when integrated over time, is symmetrical about zero volts. The waveform is not as square as when it started at the control because the finite impedance of C1 and the magnetizing inductance of T1 primary winding lead to a certian amount of sagging. Component values are traditionally selected to minimize this sagging, in order to maintain an adequate gate drive level. The voltage at node C is similar to that at node B. The gate drive voltage has its dc level restored by capacitor C2 and diode D1 to produce the voltage at node D. The negative swing of the signal is limited by the forward drop of diode D1. This type of coupling has been used for years for dc restoration of a video signal in television receivers.

This asymmetrical transformer coupling with dc restoration, disclosed in the prior art, has a significant disadvantage: a transformer with a sufficiently high inductance to sustain the gate voltage without excessive sagging also has a high leakage inductance. Thus, such a transformer is not well suited to supply to the high peak currents required to overcome the effects of miller capacitance in the power MOSFET or IGBT gate circuits. When an asymmetrical signal (FIG. 4A) is applied to the input nodes A-B, the voltage across the transformer primary (nodes C-D) is as previously described, with the AC content substantially unchanged but the DC content lost (FIG. 4B). (In this exemplary circuit, the transformer ratio is 1 to 1; practical embodiments, however, would likely employ a ratio closer to 1.5 to 1.) The secondary voltage across nodes E-F (FIG. 4C) is also similar to that of the conventional circuit.

Figure 4E:
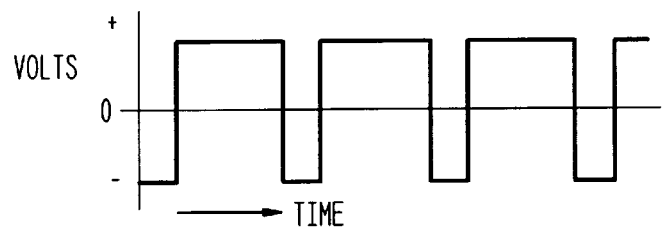

In accordance with the invention, a DC restoration circuit 41 comprises: a DC blocking capacitor C2, a bipolar limiter (illustratively implemented as two back-to-back zener diodes D1-D2), and a resistor R1. The action of charging and discharging capacitor C2 through resistor R1 produces an output signal (FIG. 4D) across nodes G-H that is centered about the zero level. Thus, the AC energy in the input signal is used to restore the DC level at the output. T1's secondary voltage is preferably chosen to be high enough so that the output voltage always meets the level clamped by the limiter diodes D1-D2. Under these conditions, the resulting waveform across nodes J-K is as shown in FIG. 4E, regardless of the input duty cycle. This signal has positive and negative excursions that are tightly controlled to the required gate voltages for the subsequent switching.

In practice, the asymmetrical transformer coupling shown in FIG. 4 is not an efficient transmitter of power because of the losses in R1, D1 and D2. This, however, can be readily overcome by adding an output buffer.

Figure 5:
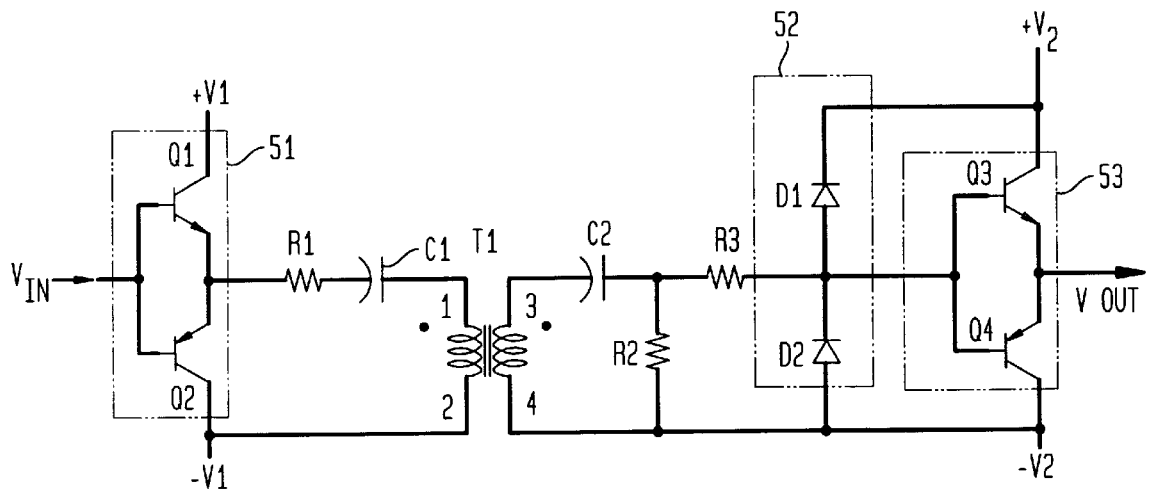
FIG. 5 shows a transformer coupling with buffers in accordance with the invention.

Reference is now made to FIG. 5, which shows a practical asymmetrical transformer coupling with an input buffer 51 and output buffer 53. The signal input $V_{IN}$, which would typically originate from a logic gate or voltage comparator, is first buffered by input buffer 51, illustratively implemented as back-to-back emitter followers Q1 and Q2. DC power for input buffer 51 is preferably derived from the same source used for other control circuitry. Input blocking capacitor C1 has associated therewith a series resistor R1 to limit charging and discharging currents that occur when the input on-to-off duty cycle is rapidly changed.

On the secondary side of transformer T1, supply voltage $-V2$ may be derived from the negative terminal of the switching transistor, or from an even more negative source so as to apply a turn-off bias for the switching transistor. A resistor R2 is added between C2 and $-V2$ in order to bias the switch-off at times when there are no pulses present. Limiter 52 comprises back-to-back diodes D1 and D2, which, in this case, are preferably high speed, rather than zener, diodes. D1 conducts when the capacitor voltage is greater than $+V2$ and D2 conducts when it is more negative than $-V2$. The waveform at the junction of D1, D2 and R3 is thus similar to that shown in FIG. 4E. An output buffer 53 comprising emitter followers Q3 and Q4 provides current amplification and power to drive the switching transistor's input. The addition of the output buffer stage reduces the requirement for low leakage inductance in the transformer, because the high peak currents required by the switching transistor gate are supplied by the buffer transistors Q3 and Q4. The configuration, as indicated by the designations "$+V2$" and "$-V2$", does require a dedicated supply for the positive and negative voltages $+V2$ and $-V2$, so that the output voltage may be tailored to the optimal MOSFET gate voltage. The individual isolated supplies may be generated in many different ways and are not the subject of this invention.

Of course, the embodiments described above are intended to represent an exemplary, not an exhaustive, set. For example, the invention can be applied to many other systems, such as forward, flyback, flyforward and resonant switching power supplies, switching audio amplifiers, switching deflection amplifiers, bridge inverters and amplifiers, and motor and/or position controls. Therefore, while one skilled in the art will likely contemplate various alterations/improvements to the disclosed embodiments, the fact that such alternative embodiments may not be specifically spelled out among the examples presented shall not be construed to imply that such alternative embodiments do not fall within the scope of applicant's invention, which is defined solely by reference to the following claims.

What is claimed is:

1. A high-frequency drive circuit for controlling the operation of a transistor switching device, comprising:
   a transformer having low-inductance windings, for transforming a primary voltage to a secondary voltage substantially greater than the required output voltage;
   a first low-valued blocking capacitor for coupling an input signal having a first duty cycle to said transformer, wherein said value is selected to permit sudden changes in duty cycle;
   a high-speed DC restoration circuit for receiving said secondary voltage and producing an output signal having a second duty cycle similar to said first duty cycle and a substantially stable DC component, wherein said DC restoration circuit comprises a second low-valued blocking capacitor, a current limiting resistor, and a bipolar limiter.

an active output buffer for coupling said output signal to the switching transistor.

2. A drive circuit according to claim 1, wherein said bipolar limiter is comprised of high-speed back-to-back diodes.

3. A drive circuit according to claim 1, wherein said DC restoration circuit further comprises a resistor disposed between (1) the junction of said second blocking capacitor with said bipolar limiter and (2) the negative supply voltage, wherein said resistor is provided for the purpose of avoiding an uncertain transistor output state by pulling down the transistor control voltage when no pulses are present.

4. A voltage coupling circuit according to claim 2, wherein said limiter comprises back-to-back diodes.

5. A voltage coupling circuit as defined in claim 1, further comprising:

an active input buffer for coupling said input signal to said transformer.

6. A voltage coupling circuit as defined in claim 1, further comprising:

an active output buffer for coupling said output signal to other circuitry.

7. A voltage coupling circuit according to claim 1, wherein said first duty cycle is a variable duty cycle.

8. A method of coupling a signal between first and second isolated circuits comprising the steps of:

coupling said signal from said first isolated circuit to a primary stage of a transformer;

coupling said signal from secondary stage of the transformer to a DC restoration circuit;

coupling said signal from the DC restoration circuit to said second isolated circuit; and limiting said signal from said DC restoration circuit to said second isolated circuit.

9. A method of coupling a signal according to claim 8, said method further comprising the step of:

actively buffering said signal from said first isolated circuit to said primary stage of said transformer.

10. A drive circuit for controlling the operation of a transistor switching device by providing an output signal, comprising:

a transformer having low inductance windings for transforming a primary voltage to a secondary voltage having amplitude substantially greater than said output signal;

a first blocking capacitor for coupling an input signal having a first duty cycle to said transformer, wherein the value of said first blocking capacitor is selected to permit sudden changes in duty cycle;

a high-speed DC restoration circuit for receiving said secondary voltage and producing said output signal having a second duty cycle similar to said first duty cycle and a substantially stable DC component, wherein said DC restoration circuit comprises a second blocking capacitor, a current limiting resistor, and a bipolar limiter; and an active output buffer for coupling said output signal to said transistor switching device.

11. A drive circuit according to claim 10, wherein said bipolar limiter is comprised of high-speed back-to-back diodes.

12. A drive circuit according to claim 10, wherein said DC restoration circuit further comprises a resistor disposed between (1) the junction of said second blocking capacitor with said bipolar limiter and (2) the negative supply voltage, wherein said resistor avoids an uncertain transistor output state by pulling down the transistor control voltage when no pulses are present.

13. A drive circuit according to claim 10, wherein said first duty cycle is a variable duty cycle.

14. A method of coupling a high-frequency signal between an isolated circuit and a transistor switching device, comprising the steps of:

coupling said high-frequency signal from said isolated circuit to a dc blocking capacitor;

coupling said high-frequency signal from said dc blocking capacitor to the primary coil of a low-inductance transformer;

coupling said high-frequency signal from the secondary coil of said transformer to a high-speed DC restoration circuit;

shaping the waveform of said high-frequency signal to provide an optimal control signal suited to said switching device; and actively buffering said high-frequency signal from said primary coil of said transformer to said switching device;

wherein said buffering is provided to enable the minimization of the inductance of the coupling transformer and the capacitance of the DC restoration circuit in order to permit crisp high-frequency switching.

\* \* \* \* \*